United States Patent
Yeh et al.

(10) Patent No.: US 12,414,418 B2
(45) Date of Patent: Sep. 9, 2025

(54) DISPLAY DEVICE

(71) Applicant: InnoLux Corporation, Miao-Li County (TW)

(72) Inventors: Tsu-Ming Yeh, Miao-Li County (TW); Wen-Kuei Ho, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 215 days.

(21) Appl. No.: 18/164,888

(22) Filed: Feb. 6, 2023

(65) Prior Publication Data

US 2023/0290914 A1    Sep. 14, 2023

(30) Foreign Application Priority Data

Mar. 11, 2022   (CN) .......................... 202210237864.X

(51) Int. Cl.
| | |
|---|---|
| *H10H 20/855* | (2025.01) |
| *G02F 1/1335* | (2006.01) |
| *G02F 1/13357* | (2006.01) |
| *H01L 25/075* | (2006.01) |
| *H10H 20/851* | (2025.01) |

(52) U.S. Cl.
CPC ..... *H10H 20/855* (2025.01); *G02F 1/133512* (2013.01); *G02F 1/133603* (2013.01); *G02F 1/133611* (2013.01); *H01L 25/0753* (2013.01); *H10H 20/8513* (2025.01); *H10H 20/8515* (2025.01); *G02F 1/133608* (2013.01)

(58) Field of Classification Search
CPC ......... G02F 1/133512; G02F 1/133603; G02F 1/133608; G02F 1/133614; H01L 33/504; H10H 29/8513; H10H 29/8515
See application file for complete search history.

(56) References Cited

U.S. PATENT DOCUMENTS

| | | | |
|---|---|---|---|
| 11,092,861 B2 | 8/2021 | Cheng et al. | |
| 2006/0061539 A1* | 3/2006 | Song ................ | G02F 1/133603 |
| | | | 345/102 |
| 2019/0018287 A1* | 1/2019 | Lüchinger ............ | C09K 11/665 |
| 2020/0166794 A1* | 5/2020 | Cheng ............... | G02F 1/136209 |
| 2020/0286967 A1 | 9/2020 | Kuo et al. | |
| 2020/0341337 A1* | 10/2020 | Sato .................. | G02F 1/133603 |

FOREIGN PATENT DOCUMENTS

| | | | |
|---|---|---|---|
| CN | 111221162 A | | 6/2020 |
| CN | 112198716 A | * | 1/2021 |
| CN | 113025112 A | | 6/2021 |
| TW | I670850 B | | 9/2019 |

OTHER PUBLICATIONS

Chinese language office action dated Feb. 15, 2024, issued in application No. TW 111137788.

* cited by examiner

*Primary Examiner* — Jessica M Merlin
(74) *Attorney, Agent, or Firm* — McClure, Qualey & Rodack, LLP

(57) ABSTRACT

A display device is provided. The display device includes a substrate, a light-shielding layer, a plurality of first light-emitting elements, and a plurality of second light-emitting elements. The light-shielding layer is disposed on the substrate. The first light-emitting elements are disposed on the substrate. The second light-emitting elements are disposed between the light-shielding layer and the substrate. One of the second light-emitting elements is alternately disposed between any two adjacent first light-emitting elements.

19 Claims, 5 Drawing Sheets

DISPLAY DEVICE

CROSS REFERENCE TO RELATED APPLICATIONS

This application claims priority of China Patent Application No. 202210237864.X, filed on Mar. 11, 2022, the entirety of which is incorporated by reference herein.

BACKGROUND

Field of the Invention

The present disclosure relates to a display device, and, in particular, to a display device provided with light-emitting elements in a non-display region.

Description of the Related Art

Electronic devices with display panels, such as smartphones, tablet computers, notebook computers, monitors, and TVs, have become indispensable necessities in modern society. With the vigorous development of such portable electronic products, consumers have higher expectations for the quality, function, and price of such products.

During the evolution of display devices, in order to meet requirements for high resolution and achieve higher productivity, these display devices are constantly being miniaturized, resulting in many unsolved problems in the process of manufacturing light-emitting devices. While existing display devices generally meet the needs of the user, they are not entirely satisfactory in every respect. Therefore, it is still necessary to improve the structure of display devices in order to manufacture a display device that meets product requirements.

BRIEF SUMMARY

A display device is provided according to some embodiments of the present disclosure. The display device includes a substrate, a light-shielding layer, a plurality of first light-emitting elements, and a plurality of second light-emitting elements. The light-shielding layer is disposed on the substrate. The first light-emitting elements are disposed on the substrate. The second light-emitting elements are disposed between the light-shielding layer and the substrate. One of the second light-emitting elements is alternately disposed between any two adjacent first light-emitting elements.

In order to make the features or advantages of the present disclosure more comprehensible, some embodiments are illustrated hereinafter, and detailed descriptions are provided with reference to the drawings.

DETAILED DESCRIPTION

Figure 1A:
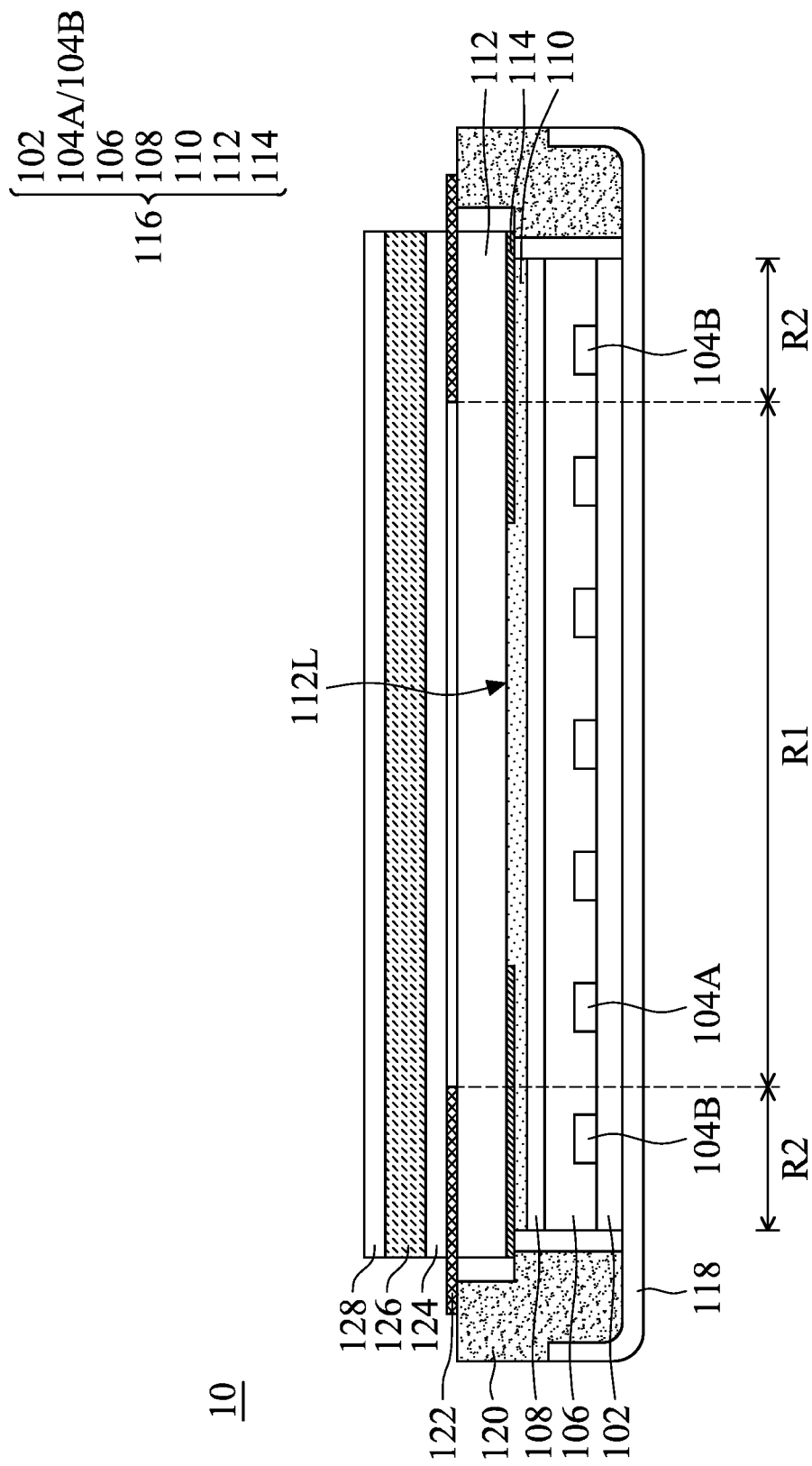
FIG. 1A is a cross-sectional view illustrating a display device according to some embodiments of the present disclosure.

Hereinafter is a detailed description of the display device of the embodiments of the present disclosure. It should be understood that the following description provides many different embodiments for implementing various aspects of some embodiments of the present disclosure. The specific elements and arrangements described below are merely to clearly describe some embodiments of the present disclosure. Of course, these are only used as examples rather than limitations of the present disclosure. Furthermore, similar and/or corresponding reference numerals may be used in different embodiments to designate similar and/or corresponding elements, in order to clearly describe the present disclosure. However, the use of these similar and/or corresponding reference numerals is only for the purpose of simply and clearly description of some embodiments of the present disclosure, and does not imply any correlation between the different embodiments and/or structures discussed.

It should be understood that the drawings of the present disclosure are not drawn to scale, and in fact, the dimensions of elements may be arbitrarily enlarged or reduced in order to clearly represent the features of the present disclosure.

In addition, when referring to "a layer is on or over another layer", it may refer to the case where the layer is in direct contact with another layer. Alternatively, it may also be the case that the layer is not in direct contact with another layer. In this case, one or more intermediate layers are disposed between the layer and another layer.

In addition, it should be understood that ordinal numbers such as "first", "second", and the like used in the specification and claims are used to modify elements and are not intended to imply and represent the element(s) have any previous ordinal numbers, and do not represent the order of a certain element and another element, or the order of the manufacturing method. The use of these ordinal numbers is only used to clearly distinguish an element with a certain name and another element with the same name. The claims and the specification may not use the same terms, for example, a first element in the specification may be a second element in the claims.

The term "about" used herein generally means within 10%, within 5%, within 3%, within 2%, within 1%, or within 0.5% of a given value or a given range. The value given herein is an approximate value, that is, the meaning of "about" may still be implied without the specific description of "about". Furthermore, the phrase "a range is greater than or equal to a first value, and the range is less than or equal to a second value" means that the range includes the first value, the second value, and other values in between.

Unless otherwise defined, all terms including technical and scientific terms used herein have the same meaning as commonly understood by a person of ordinary skills in the art. It should be understood that these terms, such as those defined in commonly used dictionaries, should be interpreted as having meanings consistent with the relevant art and the background or context of the present disclosure, and should not be interpreted in an idealized or overly formal manner, unless otherwise defined in the embodiments of the present disclosure.

According to embodiments of the present disclosure, an optical microscope (OM), a scanning electron microscope (SEM), a film thickness profiler (α-step), an ellipsometer, or other suitable methods may be used to measure the spacing or distance between elements, or the width, thickness, height, or area of each element. In detail, according to some embodiments, a scanning electron microscope may be used to obtain a cross-sectional structure image including the element to be measured, so as to measure the spacing or distance between elements, or the width, thickness, height, or area of each element.

It should be understood that in the following embodiments without departing from the spirit of the present disclosure, features in several different embodiments may be replaced, combined, and recombined to become other embodiments. As long as the features of the embodiments do not violate the spirit or conflict with each other, they may be arbitrarily recombined and used.

According to some embodiments of the present disclosure, a display device is provided. The display device includes second light-emitting elements disposed between a substrate and a light-shielding layer (i.e., within a non-display region of the display device). The second light-emitting elements are alternately disposed between two adjacent first light-emitting elements in a display region. As a result, the brightness difference between the periphery and the center of the display region of the display device may be reduced, so as to improve the problem of non-uniform brightness of the display device.

It should be understood that besides the display device, the embodiments of the present disclosure may be applied to various electronic devices, such as light-emitting devices, touch-control devices, sensing devices, antenna devices, splicing devices, or a combination thereof, but the present disclosure is not limited thereto. The electronic device may be a bendable or flexible electronic device. The electronic device may include, for example, light-emitting diodes, liquid-crystal, fluorescence, phosphor, other suitable display media, or a combination thereof, but the present disclosure is not limited thereto. The light-emitting diode may include, for example, organic light-emitting diodes (OLEDs), inorganic light-emitting diodes (LED), mini-light-emitting diodes (mini LED), micro-light-emitting diodes (micro-LEDs), quantum dots (QDs) light-emitting diode (such as QLEDs, QDLEDs), other suitable materials, or any arrangement or combination thereof, but the present disclosure is not limited thereto. The display device may include, for example, a splicing device, but the present disclosure is not limited thereto. The concepts or principles of the present disclosure mas also be applied to a non-self-luminous liquid-crystal display (LCD), but the present disclosure is not limited thereto.

The antenna device may be, for example, a liquid-crystal antenna or another type of antenna, but the present disclosure is not limited thereto. The antenna device may include, for example, a splicing-antenna device, but the present disclosure is not limited thereto. It should be noted that the electronic device may be any arrangement or combination thereof above, but the present disclosure is not limited thereto. In addition, the shape of the electronic device may be rectangular, circular, polygonal, a shape with curved edges, or other suitable shapes. The electronic device may have peripheral systems such as a driving system, a control system, a light source system, a shelf system, and the like to support the display devices, the antenna devices, or the splicing devices. The electronic device of the present disclosure may be, for example, a display device, but the present disclosure is not limited thereto.

FIG. 1A is a cross-sectional view illustrating a display device 10 according to some embodiments of the present disclosure. Referring to FIG. 1A, the display device 10 includes a substrate 102 and a light-shielding layer 122 disposed on the substrate 102. In some embodiments, the light-shielding layer 122 may be disposed on at least one side of the substrate 102. For example, the light-shielding layer 122 may be disposed on one side, two sides, or three sides of the substrate 102. In an embodiment, as shown in FIG. 1A, the light-shielding layer 122 may be disposed around the substrate 102. It should be noted that in FIG. 1A, the portion of the substrate 102 not covered by the light-shielding layer 122 is referred to herein as the "display region R1" of the display device 10, and the portion of the substrate 102 covered by the light-shielding layer 122 is referred to herein as the "non-display region R2" of the display device 10.

According to some embodiments, the substrate 102 may include a flexible substrate, a rigid substrate, or a combination thereof, but the present disclosure is not limited thereto. According to some embodiments, the material of the substrate 102 may include glass, quartz, sapphire, ceramic, polyimide (PI), polycarbonate (PC), polyethylene terephthalate (PET), polypropylene (PP), other suitable materials, or a combination thereof, but the present disclosure is not limited thereto. Furthermore, according to some embodiments, the substrate 102 may include a metal-glass fiber composite sheet or a metal-ceramic composite sheet, but the present disclosure is not limited thereto. In addition, the light transmittance of the substrate 102 is not limited, that is, the substrate 102 may be a transparent substrate, a semi-transparent substrate, or a non-transparent substrate. Furthermore, the substrate 102 may be a driving substrate of the display device 10.

In various embodiments of the present disclosure, the light-shielding layer 122 is defined as a light-shielding material that may prevent the user from observing the light penetration with the naked eye, such as a material with an optical density greater than about 3.5, or a material with light transmittance of approximately 0% for 50 W, 101 m of light according to the standard test method of JIS K 7150. In some embodiments, the material of the light-shielding layer 122 may include black photoresist, black printing ink, black resin, any other suitable light-shielding material, or a combination thereof, but the present disclosure is not limited thereto.

As shown in FIG. 1A, the display device 10 further includes a plurality of first light-emitting elements 104A and a plurality of second light-emitting elements 104B. The first light-emitting elements 104A are disposed on the substrate 102, and the second light-emitting elements 104B are disposed between the substrate 102 and the light-shielding layer 122. In detail, the first light-emitting elements 104A are disposed in the region of the substrate 102 not covered by the light-shielding layer 122. That is, the first light-emitting elements 104A are disposed in the display region R1 of the display device 10. The second light-emitting elements 104B are disposed in the region of the substrate 102 covered by the light-shielding layer 122. That is, the second light-emitting elements 104B are disposed in the non-display region R2 of the display device 10.

In some embodiments, the first light-emitting elements 104A and the second light-emitting elements 104B may be mini light-emitting diodes (mini LED), micro light-emitting diodes (micro LED), and light-emitting diodes. Furthermore, in some embodiments, the first light-emitting elements 104A and the second light-emitting elements 104B may each emit blue light, red light, green light, white light, or ultraviolet light. In an embodiment, the first light-emitting elements 104A and the second light-emitting elements 104B may emit blue light.

In some embodiments, the display device 10 may further include an adhesive layer 106. The adhesive layer 106 is formed on the substrate 102, the first light-emitting elements 104A, and the second light-emitting elements 104B. The first light-emitting elements 104A and the second light-emitting elements 104B are encapsulated in the adhesive layer 106 to prevent moisture or oxygen from damaging the first light-emitting elements 104A and the second light-emitting elements 104B.

In some embodiments, the adhesive layer 106 may be transparent or semi-transparent to avoid reducing the light extraction rate of the first light-emitting elements 104A and the second light-emitting elements 104B. The adhesive layer 106 may include organic material, inorganic material, or a combination thereof. In some embodiments, the inorganic material may include silicon nitride, silicon oxide, silicon oxynitride, aluminum oxide, any other suitable packaging material, or a combination thereof, but the present disclosure is not limited thereto. In some embodiments, the organic material includes, epoxy resin, acrylic resin such as polymethylmetacrylate (PMMA), benzocyclobutene (BCB), polyimide, polyester, polydimethylsiloxane (PDMS), perfluoroalkoxy (PFA), any other suitable protective material, or a combination thereof, but the present disclosure is not limited thereto. In some embodiments, the adhesive layer 106 may be formed by a suitable method such as chemical vapor deposition (CVD), spin-on coating, printing, or a combination thereof.

In some embodiments, the display device 10 may further include a brightness enhancement film 108. The brightness enhancement film 108 is disposed on the adhesive layer 106. The brightness enhancement film 108 enables the light emitted by the first light-emitting elements 104A and the second light-emitting elements 104B to form a relatively concentrated light source after passing through the brightness enhancement film 108. In an embodiment, the brightness enhancement film 108 may be a blue brightness enhancement film.

In some embodiments, the display device 10 may further include a color conversion layer 110 formed on the brightness enhancement film 108. According to some embodiments, the color conversion layer 110 may include polymer material with color conversion material distributed therein. The color conversion material is such as any suitable quantum dots (QDs) material, phosphor material, or phosphor material. In an embodiment, the color conversion layer 110 includes phosphorescent material. In some embodiments, the polymer material above may be a transparent polymer material. Specifically, the transparent polymer material has a high transmittance for light with wavelengths between 200 nm and 1100 nm. For example, the transparent polymer material may have a light transmittance of greater than 90% or may have a light transmittance of greater than 95%. For example, the transparent polymer material may include polymethyl methacrylate (PMMA), polyethylene terephthalate (PET), polystyrene (PS), polyethylene (PP), nylon (polyamide, PA), polycarbonate (PC), polyimide (PI), polydimethylsiloxane (PDMS), epoxy resin, silicone, and the like, or a combination thereof, but the present disclosure is not limited thereto.

According to some embodiments, when the first light-emitting elements 104A and the second light-emitting elements 104B emit blue light or ultraviolet light, suitable quantum dots material, phosphorescent material, or phosphor material may be added to the color conversion layer 110 according to product requirements to emit light with the desired color, such as red, green, or white.

In some embodiments, the display device 10 may further include an optical layer 112 disposed on the first light-emitting elements 104A and the second light-emitting elements 104B. Furthermore, according to some embodiments, the optical layer 112 may be further disposed on the color conversion layer 110. According to some embodiments, as shown in FIG. 1A, the optical layer 112 may cover the color conversion layer 110. In some embodiments, the optical layer 112 may be a diffusion plate to diffuse light passing through the underlying layer to generate a uniform surface light source. In some embodiments, the optical layer 112 may have a single-layer structure or a multi-layer structure. In an embodiment, when the optical layer 112 has a multi-layer structure, the multi-layer structure may be formed by stacking the same single-layer structures. In some embodiments, the brightness enhancement film 108 may be further disposed on the optical layer 112.

In some embodiments, the display device 10 may further include a light conversion layer 114, and the light conversion layer 114 is disposed to partially overlap with the optical layer 112. According to some embodiments, the light conversion layer 114 partially overlaps with the optical layer 112 in the normal direction of the substrate 102. In detail, in some embodiments, as shown in FIG. 1A, the light conversion layer 114 may be disposed on the lower surface 112L of the optical layer 112. In an embodiment, the light conversion layer 114 is disposed on a portion of the lower surface 112L of the optical layer 112. More specifically, the light conversion layer 114 is disposed on the edge of the lower surface 112L of the optical layer 112 such that the light conversion layer 114 is disposed to partially overlap with the optical layer 112. Furthermore, in some embodiments, the light conversion layer 114 may be disposed between the second light-emitting elements 104B and the optical layer 112. In some embodiments, the light conversion layer 114 may be further disposed between some of the first light-emitting elements 104A and the optical layer 114.

According to some embodiments, the light conversion layer 114 may include light conversion ink. In detail, the light conversion ink may include light conversion material and curing material. For example, in some embodiments, the light conversion material may include any suitable quantum dots material or phosphor material, and the curing material may include (meth)acrylic-based material or epoxy resin-based material. According to some embodiments of the present disclosure, the optical layer 112 may cover the color conversion layer 110, the first light-emitting elements 104A, and the second light-emitting elements 104B. The light emitted by the second light-emitting elements 104B located in the non-display region R2 of the display device 10 may pass through the space other than the color conversion layer 110 without passing through the color conversion layer 110, resulting in a part of the light not being converted into light with the desired color. Therefore, disposing the light conversion layer 114 on the edge of the lower surface 112L of the optical layer 112 may improve the light conversion efficiency of the second light-emitting elements 104B located in the non-display region R2 of the display device 10, so as to prevent the peripheral of the display region R1 of the display device 10 from displaying unwanted colors. In some embodiments, the light conversion layer 114 may be coated on a predetermined area (e.g., the edge of the lower surface 112L) on the lower surface 112L of the optical layer 112 by inkjet printing.

In FIG. 1A, the structure formed by the substrate 102, the first light-emitting elements 104A, the second light-emitting elements 104B, the adhesive layer 106, the brightness enhancement film 108, the color conversion layer 110, the optical layer 112, and the light conversion layer 114 may be collectively referred to herein as the "backlight module 116".

Still referring to FIG. 1A, according to some embodiments, the display device 10 may further include a case 118, and the backlight module 116 is disposed on the case 118. In some embodiments, the material of the case 118 may include metal, plastic, ceramic, other suitable materials, or a combination thereof, but the present disclosure is not limited thereto. In some embodiments, the display device 10 may further include a frame member 120. The frame member 120 is disposed on the case 118 and surrounds the backlight module 116. According to some embodiments, the material of the frame member 120 may include metal, plastic, or a combination thereof. For example, the metal may include aluminum, stainless steel, or galvanized steel, but the present disclosure is not limited thereto. Furthermore, the plastic may include polycarbonate (PC), acrylonitrile-butadiene-styrene (ABS) copolymer, and the like, or a combination thereof, but the present disclosure is not limited thereto.

According to some embodiments, as shown in FIG. 1A, the portion of the optical layer 112 not covering the color conversion layer 110 and the portion of the light conversion layer 114 not covering the color conversion layer 110 may be disposed on the frame member 120 and be in contact with the frame member 120 to ensure the light emitted from the second light-emitting elements 104B may pass through the light conversion layer 114 to avoid the problem of incomplete light conversion.

In some embodiments, the light-shielding layer 122 of the display device 10 may be disposed on the backlight module 116 and the frame member 120. As described above, the region of the substrate 102 covered by the light-shielding layer 122 may be referred to as the non-display region R2 of the display device 10, and the second light-emitting elements 104B are disposed in the non-display region R2. The region of the substrate 102 not covered by the light-shielding layer 122 may be referred to as the non-display region R1 of the display device 10, and the first light-emitting elements 104A are disposed in the display region R1.

In some embodiments, the display device 10 may further include a polarizing plate 124, a polarizing plate 128, and a liquid-crystal layer 126. The polarizing plate 124, the polarizing plate 128, and the liquid-crystal layer 126 are disposed on the backlight module 116 and the light-shielding layer 122. As shown in FIG. 1A, the liquid-crystal layer 126 is sandwiched between the polarizing plate 124 and the polarizing plate 128. In other words, the polarizing plate 124 and the polarizing plate 128 are disposed on opposite sides (i.e., the upper surface and the lower surface) of the liquid-crystal layer 126.

According to some embodiments, the material of the polarizing plate 124 and the polarizing plate 128 may include polyvinyl alcohol (PVA) or other suitable materials, but the present disclosure is not limited thereto. In other embodiments, the polarizing plate 124 and the polarizing plate 128 may each be a wire grid polarizer (WGP).

According to some embodiments, the liquid-crystal layer 126 may include liquid-crystal molecules (not shown). In some embodiments, the image displayed may be adjusted by applying different electric fields to the liquid-crystal layer 126 to change the alignment direction of the liquid-crystal molecules. In some embodiments, the material of the liquid-crystal layer 126 may include nematic liquid-crystal, smectic liquid-crystal, cholesteric liquid-crystal, blue-phase liquid-crystal, other suitable liquid-crystal materials, or a combination thereof, but the present disclosure is not limited thereto. However, according to other embodiments, the liquid-crystal layer 126 may be replaced with modulation material having different properties (e.g., permittivity) through application of an electric field or other adjustments.

Figure 1B:
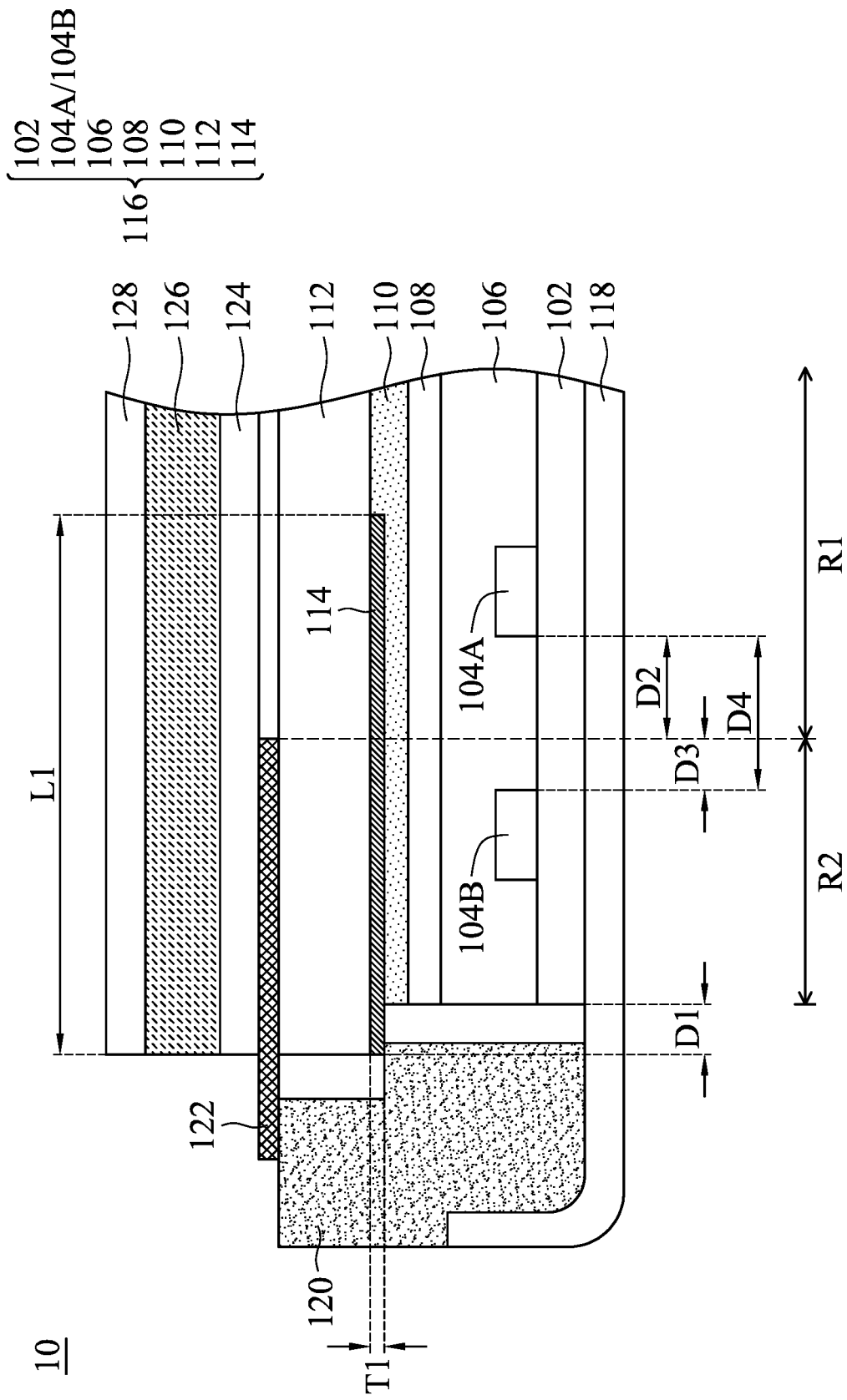
FIG. 1B is a partially enlarged view illustrating the display device of FIG. 1A according to some embodiments of the present disclosure.

Next, refers to FIG. 1B, which is a partially enlarged view illustrating the display device of FIG. 1A according to some embodiments of the present disclosure. According to some embodiments, the thickness T1 of the light conversion layer 114 may be between about 1 μm and about 10 μm. If the thickness T1 of the light conversion layer 114 is too large (e.g., greater than about 10 μm), the light conversion layer 114 may affect the color of the light passing through the light conversion layer 114 because the material of the light conversion layer 114 may absorb light having a specific wavelength. If the thickness T1 of the light conversion layer 114 is too small (e.g., less than about 1 μm), the light conversion efficiency of the light conversion layer 114 may be too low to achieve the desired light conversion effect.

According to some embodiments, the distance D1 between the outer edge of the light conversion layer 114 and the sidewall of at least one of the substrate 102, the adhesive layer 106, the brightness enhancement film 108, or the color conversion layer 110 is between about 0.3 mm and about 0.5 mm. In other words, the length of the portion of the light conversion layer 114 extending outward from at least one of the substrate 102, the adhesive layer 106, the brightness enhancement film 108, or the color conversion layer 110 is the distance D1 shown in FIG. 1B.

According to some embodiments, the distance D2 between the inner edge of the light-shielding layer 122 in the normal direction of the substrate 102 and the first light-emitting element 104A at the outermost periphery of the display region R1 is about 0.3 mm to about 0.5 mm. If the distance D2 is too large, for example, greater than about 0.5 mm, the dark band around the display region R1 due to insufficient brightness is more obvious. If the distance D2 is too small, for example, less than about 0.3 mm, the disposition space of the second light-emitting element 104B in the non-display region R2 is limited. The portion of the substrate 102 covered by the light-shielding layer 122 belongs to the non-display region R2 of the display device 10. Therefore, the distance between the boundary of the non-display region R2 (i.e., the boundary between the display region R1 and the non-display region R2) and the first light-emitting element 104A at the outermost periphery of the display region R1 is also the distance D2.

On the other hand, according to some embodiments, the distance D3 between the boundary of the non-display region R2 (i.e., the inner edge of the light-shielding layer 122, the boundary of the display region R1 and the non-display region R2) and the second light-emitting element 104B in the normal direction of the substrate 102 may be between about 0 mm and about 0.2 mm. If the distance D3 is too large, for example, greater than about 0.2 mm, the dark band around the display region R1 due to insufficient brightness is more obvious. In an embodiment, when the distance D3 between the boundary of the non-display region R2 and the second light-emitting element 104B is about 0 mm, the sidewall of the second light-emitting element 104B may be aligned with the boundary of the non-display region R2, thereby enhancing the brightness of the periphery of the display region R1. That is, the problem of the obvious dark band around the display region R1 may be alleviated.

As shown in FIG. 1B, the distance D4 between the first light-emitting element 104A and the second light-emitting element 104B is the sum of the above distance D2 and distance D3. In some embodiments, the distance D4 between the first light-emitting element 104A and the second light-emitting element 104B may be between about 0.3 mm and about 0.7 mm. If the distance D4 between the first light-emitting element 104A and the second light-emitting element 104B is too large, e.g., greater than about 0.7 mm, the dark band around the display region R1 due to insufficient brightness is more obvious. If the distance D4 between the first light-emitting element 104A and the second light-emitting element 104B is too small, for example, less than about 0.3 mm, sufficient space may not be reserved between the first light-emitting element 104A and the second light-emitting element 104B to ensure that the first light-emitting elements 104A are disposed in the display region R1 and the second light-emitting elements 104B are disposed in the non-display region R2.

According to some embodiments, the length L1 from the outer edge to the inner edge of the light conversion layer 114 may be between about 2.15 mm and about 2.55 mm. In some embodiments, as shown in FIG. 1B, the outer edge of the light conversion layer 114 may be aligned with the edge of the optical layer 112 in the normal direction of the substrate 102, but the present disclosure is not limited thereto. If the length L1 from the outer edge to the inner edge of the light conversion layer 114 is too large (for example, greater than about 2.55 mm), the light conversion layer 114 will significantly affect the light emitted by the first light-emitting elements 104A in the display region R1 and cause light with undesirable color. Conversely, if the length L1 from the outer edge to the inner edge of the light conversion layer 114 is too small (for example, less than about 2.15 mm), the light emitted from the second light-emitting elements 104B without passing through the color conversion layer 110 may not be effectively converted, and resulting in the phenomenon of non-uniform color around the display region R1 of the device 10.

Figure 2:
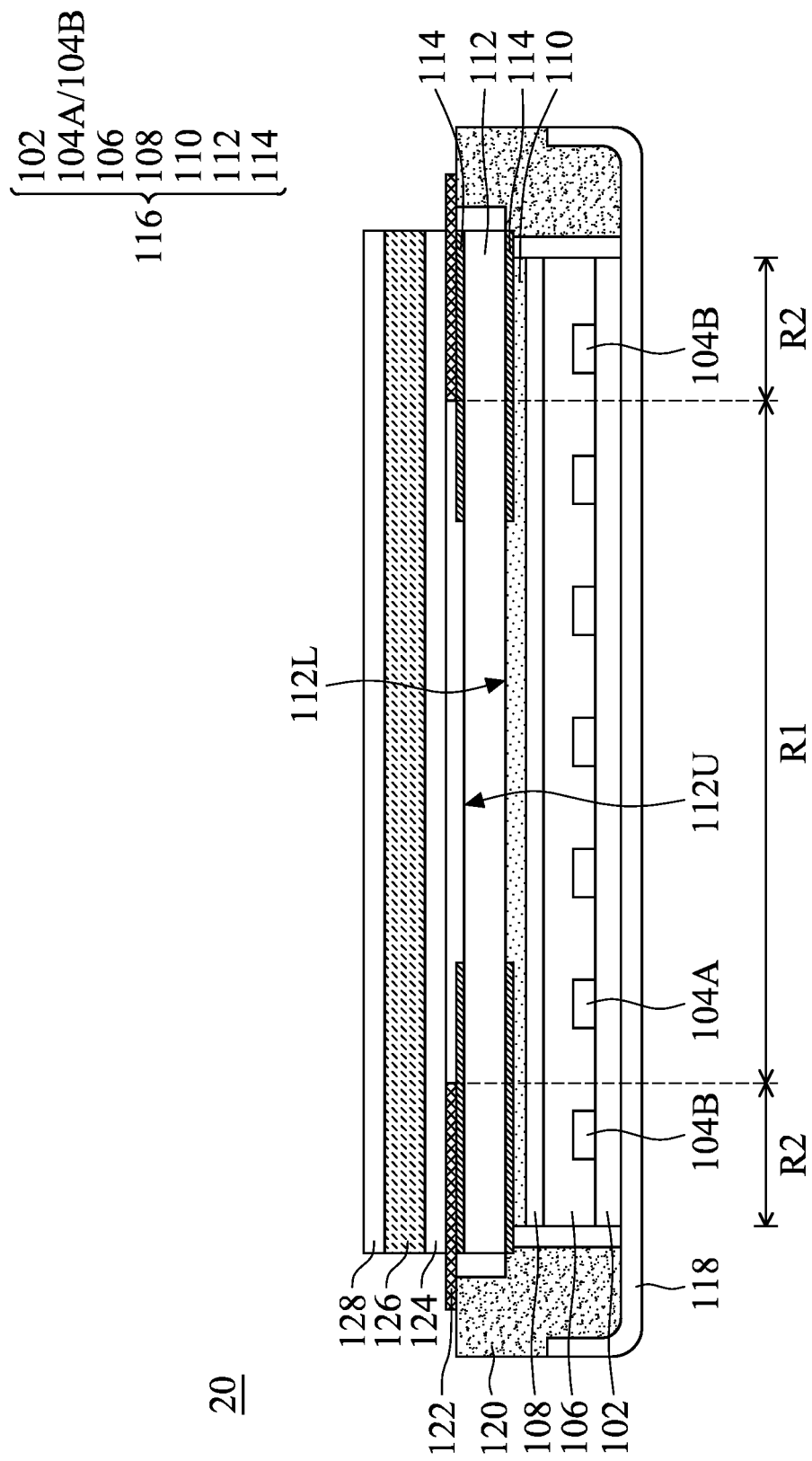
FIG. 2 is a cross-sectional view illustrating a display device according to other embodiments of the present disclosure.

Next, referring to FIG. 2, which is a cross-sectional view illustrating the display device 20 according to other embodiments of the present disclosure. The display device 20 shown in FIG. 2 is similar to the display device 10 shown in FIG. 1, but an additional light conversion layer 114 is further disposed on the upper surface 112U of the optical layer 112 in the display device 20. The material and size of the light conversion layer 114 disposed on the upper surface 112U of the optical layer 112 may be the same as those of the light conversion layer 114 disposed on the lower surface 112L of the optical layer 112, so the description is omitted. Furthermore, the position of the light conversion layer 114 disposed on the upper surface 112U of the optical layer 112 may be the same as the position of the light conversion layer 114 disposed on the lower surface 112L of the optical layer 112. In other words, the light conversion layer 114 on the upper surface 112U may be aligned with the light conversion layer 114 on the lower surface 112L in the normal direction of the substrate 102.

Figure 3:
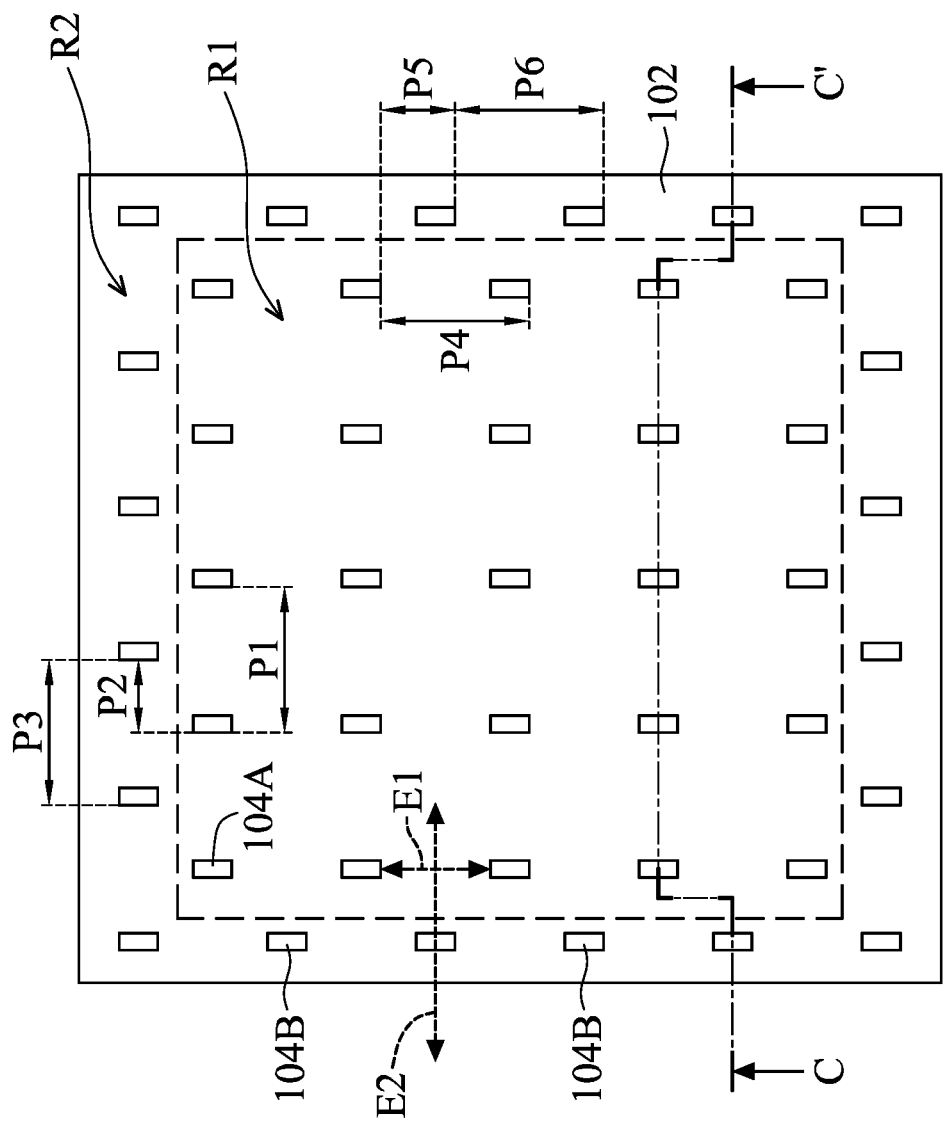
FIG. 3 and FIG. 4 are top views illustrating display devices according to various embodiments of the present disclosure.
Figure 4:
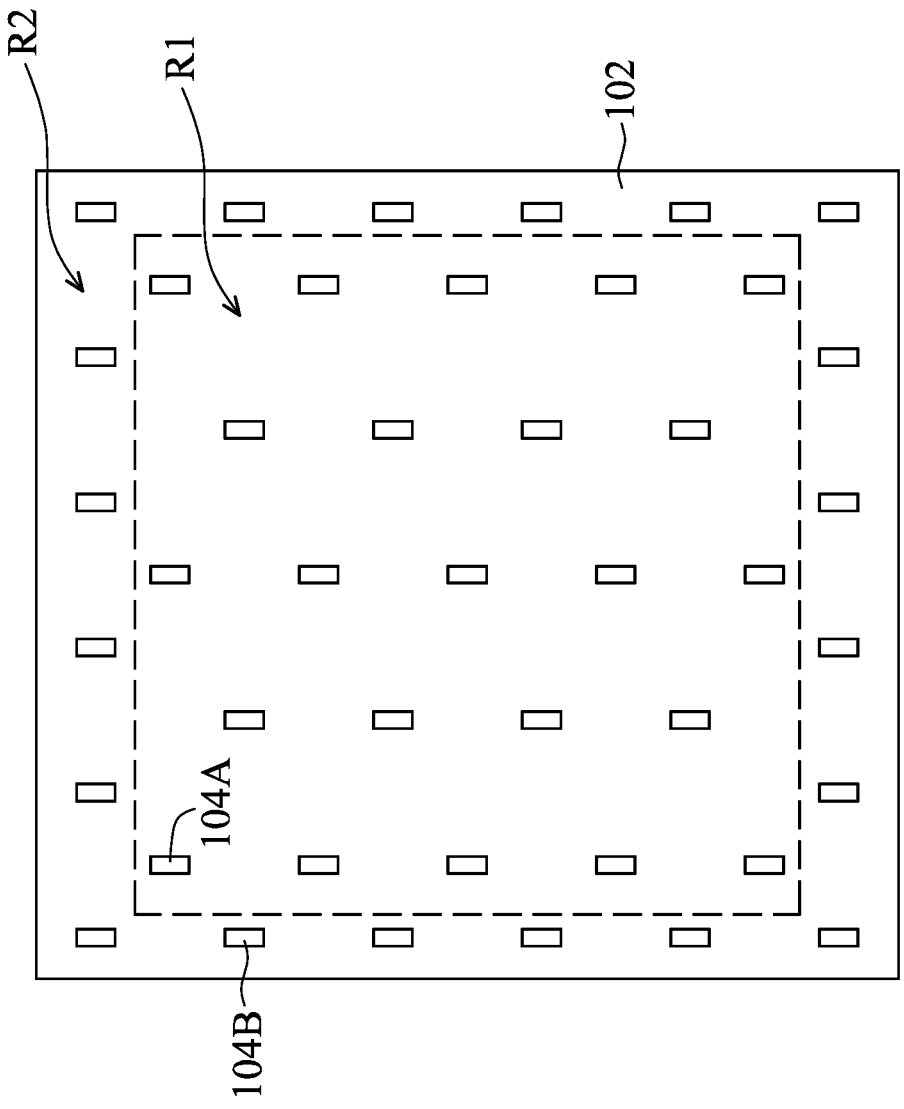

FIG. 3 and FIG. 4 are top views respectively illustrating the display device 10 and display device 30 according to various embodiments of the present disclosure. It should be noted that the cross-sectional view of FIG. 1A is taken alone the line CC' in FIG. 3. Furthermore, for the sake of clarity, many elements and layers are omitted in FIG. 3 and FIG. 4 to facilitate the description of the illustrated embodiment.

As shown in FIG. 3, the second light-emitting elements 104B are disposed alternately between two adjacent light-emitting elements 104A. Specifically, the second light-emitting elements 104B are disposed alternately between two adjacent first light-emitting elements 104A in the outermost periphery of the display region R1. In detail, according to some embodiments, there is an extension line E1 between any two adjacent first light-emitting elements 104A in the outermost periphery of the display region R1 in the A direction, and one of the second light-emitting elements 104B in the non-display region R2 has an extension line E2 in the B direction. In some embodiments, the extension direction of the extension line E1 and the extension direction of the extension line E2 are different, so that the extension line E1 and the extension line E2 intersect each other. In some embodiments, the extension line E1 and the extension line E2 may be perpendicular to each other. When the extension line E1 and the extension line E2 are perpendicular to each other, the A direction and the B direction are also perpendicular to each other.

According to some embodiments, as shown in FIG. 3, the first light-emitting elements 104A and the second light-emitting elements 104B may be alternately disposed in the A direction. Likewise, according to some embodiments, the first light-emitting elements 104A and the second light-emitting elements 104B may be alternately disposed in the B direction.

According to the embodiments provided by the present disclosure, the second light-emitting elements 104B in the non-display region R2 of the display device 10 and the first light-emitting elements 104A in the display region R1 of the display device 10 are alternately disposed, which may further alleviate the problem of the non-uniform brightness of the peripheral of the display region R1 and thus avoid the generation of the dark band with insufficient brightness around the display region R1.

Still referring to FIG. 3, according to some embodiments, the second light-emitting elements 104B are disposed around the first light-emitting elements 104A. In other embodiments, the second light-emitting elements 104B may be disposed on at least one side of the first light-emitting element 104A. When the dark band with insufficient brightness occurs on one side of the periphery of the display region R1, the second light-emitting elements 104B may be disposed on the side to compensate the problem of insufficient brightness. Similarly, if there are dark bands with insufficient brightness around the display region R1 on multiple sides, the second light-emitting elements 104B may be disposed on two sides, three sides, or each side.

Furthermore, according to some embodiments, the pitch P1 between two adjacent first light-emitting elements 104A and the pitch P3 between two adjacent second light-emitting elements 104B may be the same in the B direction. In other embodiments, the pitch P1 and the pitch P3 may be different. In the embodiment in which the pitch P1 and the pitch P3 are the same, the pitch P2 between the first light-emitting element 104A and the second light-emitting element 104B in the B direction is ½ of the pitch P1 and the pitch P3. Likewise, according to some embodiments, the pitch P4 between two adjacent first light-emitting elements 104A and the pitch P6 between two adjacent second light-emitting elements 104B may be the same in the A direction. In other embodiments, the pitch P4 and the pitch P6 may be different. In the embodiment in which the pitch P4 and the pitch P6 are the same, the pitch P5 between the first light-emitting element 104A and the second light-emitting element 104B in the A direction is ½ of the pitch P4 and the pitch P6.

Next, referring to FIG. 4, the display device 30 shown in FIG. 4 is similar to the display device 10 shown in FIG. 3, but the first light-emitting elements 104A in the display region R1 of the display device 30 are alternately disposed. In detail, according to some embodiments, the first light-emitting elements 104A and the adjacent first light-emitting elements 104A are alternately disposed in the A direction, and the first light-emitting elements 104A are also alternately disposed in the B direction with the adjacent first light-emitting elements 104A. Therefore, as shown in FIG. 4, the first light-emitting elements 104A located in the same column or row and the first light-emitting elements 104A adjacent to one column or adjacent to one row are staggered to each other.

It should be noted that although FIG. 3 and FIG. 4 respectively illustrate that the first Light-emitting elements 104A may be disposed on the substrate 102 in different arrangements in the display region R1, the present disclosure is not limited thereto. In other embodiments, the first light-emitting elements 104A may be disposed on the substrate 102 in any manner in the display region R1.

As mentioned above, according to some embodiments of the present disclosure, a display device includes first light-emitting elements located in a display region and second light-emitting elements located in a non-display region. The second light-emitting elements are alternately disposed between two adjacent first light-emitting elements. In this way, the brightness difference between the periphery and the center of the display region of the display device may be reduced, so as to alleviate the problem of non-uniform brightness of the display device. In addition, according to some embodiments, the display device may further include a light conversion layer disposed on the lower surface of the optical layer. Disposing the light conversion layer on the edge of the lower surface of the optical layer may improve the light conversion efficiency of the second light-emitting elements located in the non-display region of the display device, so as to prevent the periphery of the display region of the display device from displaying unwanted colors.

Although some embodiments of the present disclosure and their advantages have been disclosed above, it should be understood that a person of ordinary skill in the art may change, replace and/or modify the present disclosure without departing from the spirit and scope of the present disclosure. The features between the embodiments of the present disclosure may be arbitrarily combined as long as they do not violate or conflict with the spirit of the disclosure. In addition, the scope of the present disclosure is not limited thereto the process, machine, manufacturing, material composition, device, method, and step in the specific embodiments described in the specification. A person of ordinary skill in the art will understand current and future process, machine, manufacturing, material composition, device, method, and step from the content disclosed in the present disclosure, as long as the current or future process, machine, manufacturing, material composition, device, method, and step performs substantially the same functions or obtain substantially the same results as the present disclosure. Therefore, the scope of the present disclosure includes the above-mentioned process, machine, manufacturing, material composition, device, method, and steps. The scope of the present disclosure should be determined by the scope of the claims. It is not necessary for any embodiment or claim of the present disclosure to achieve all of the objects, advantages, and/or features disclosed herein.

What is claimed is:

1. A display device, comprising:
    a substrate;
    a light-shielding layer disposed on the substrate;
    a plurality of first light-emitting elements disposed on the substrate;
    a plurality of second light-emitting elements disposed between the light-shielding layer and the substrate, wherein one of the plurality of second light-emitting elements is alternately disposed between any two adjacent first light-emitting elements;
    an optical layer disposed on the plurality of first light-emitting elements and the plurality of second light-emitting elements;
    a color conversion layer disposed on the plurality of first light-emitting elements and the plurality of second light-emitting elements;
    a light conversion layer that partially overlaps the optical layer, and exposing at least a portion of the plurality of first light-emitting elements; and
    a liquid-crystal layer, wherein the optical layer, the color conversion layer, and the light conversion layer are disposed between the substrate and the liquid-crystal layer.

2. The display device as claimed in claim 1, wherein the two adjacent first light-emitting elements have a first extension line in a first direction, the second light-emitting element has a second extension line in a second direction, and the first extension line intersects the second extension line.

3. The display device as claimed in claim 2, wherein the first extension line and the second extension line are perpendicular to each other.

4. The display device as claimed in claim 1, wherein the plurality of second light-emitting elements are disposed to surround the plurality of first light-emitting elements.

5. The display device as claimed in claim 1, wherein the plurality of second light-emitting elements are disposed on at least one side of the plurality of first light-emitting elements.

6. The display device as claimed in claim 1, wherein the light conversion layer is disposed between the plurality of second light-emitting elements and the optical layer.

7. The display device as claimed in claim 1, wherein the light conversion layer is disposed between some of the plurality of first light-emitting elements and the optical layer.

8. The display device as claimed in claim 1, wherein the optical layer has a single-layer structure or a multi-layer structure.

9. The display device as claimed in claim 1, wherein the light conversion layer is further disposed on an upper surface of the optical layer.

10. The display device as claimed in claim 9, wherein the light conversion layer disposed on the upper surface of the optical layer is aligned with the light conversion layer that partially overlaps the optical layer in a normal direction of the substrate.

11. The display device as claimed in claim 1, wherein an outer edge of the light conversion layer is aligned with an edge of the optical layer in a normal direction of the substrate.

12. The display device as claimed in claim 1, further comprising a frame member surrounding the plurality of first light-emitting elements and the plurality of second light-emitting elements, wherein a portion of the optical layer and a portion of the light conversion layer are disposed on the frame member and are in contact with the frame member.

13. The display device as claimed in claim 1, wherein the substrate comprises a display region and a non-display region, the light-shielding layer covers the non-display region, the plurality of first light-emitting elements are disposed in the display region, and the plurality of second light-emitting elements are disposed in the non-display region.

14. The display device as claimed in claim 13, wherein sidewalls of the plurality of second light-emitting elements are aligned with a boundary of the non-display region.

15. The display device as claimed in claim 1, further comprising an adhesive layer formed on the substrate, the plurality of first light-emitting elements, and the plurality of second light-emitting elements, wherein the adhesive layer encapsulates the plurality of first light-emitting elements and the plurality of second light-emitting elements.

16. The display device as claimed in claim 1, wherein the plurality of first light-emitting elements located in the same column or row and the plurality of first light-emitting elements adjacent to one column or adjacent to one row are staggered to each other.

17. The display device as claimed in claim 1, wherein a first pitch between two adjacent first light-emitting elements and a second pitch between two adjacent second light-emitting elements are the same.

18. The display device as claimed in claim 17, wherein a third pitch between a first light-emitting element and an adjacent second light-emitting element is ½ of the first pitch and the second pitch.

19. The display device as claimed in claim 1, further comprising a brightness enhancement film disposed on the plurality of first light-emitting elements and the plurality of second light-emitting elements.

* * * * *